United States Patent [19]

Ciparisso

[11] Patent Number: 5,138,974
[45] Date of Patent: Aug. 18, 1992

[54] VACUUM APPARATUS FOR COATING AN OPTICAL SUBSTRATE

[75] Inventor: Delio Ciparisso, Ascona, Switzerland
[73] Assignee: Satis Vacuum AG, Zürich, Switzerland
[21] Appl. No.: 704,079
[22] Filed: May 22, 1991
[30] Foreign Application Priority Data
  May 22, 1990 [CH] Switzerland ............ 1742/90
[51] Int. Cl.⁵ .................. C23C 14/24; C23C 14/50
[52] U.S. Cl. ........................ 118/731; 118/500
[58] Field of Search ............ 118/730, 731, 500

[56] References Cited

U.S. PATENT DOCUMENTS

| | | | |
|---|---|---|---|
| 3,983,838 | 10/1976 | Christensen | 118/730 |
| 4,034,704 | 7/1977 | Wossner | 118/730 |
| 4,062,318 | 12/1977 | Ban | 118/500 |
| 4,817,559 | 4/1989 | Ciparisso | 118/731 |

Primary Examiner—Richard Bueker
Attorney, Agent, or Firm—Spencer, Frank & Schneider

[57] ABSTRACT

In a vacuum vapor deposition apparatus for coating one side of an optical substrate in an evacuable container, above at least one vapor source, a rotatable support structure is provided. The support structure includes a plurality of at least approximately circular segment-shaped pivotable support plates which are positionable cup-like relative to each other and are supported on a common rotating axle, each pivotable about 180°. Each of the pivotable support plates has support areas on both sides with mechanisms for clamping securely substrates which are to be coated on one side and which sit on the respective supporting areas.

9 Claims, 1 Drawing Sheet

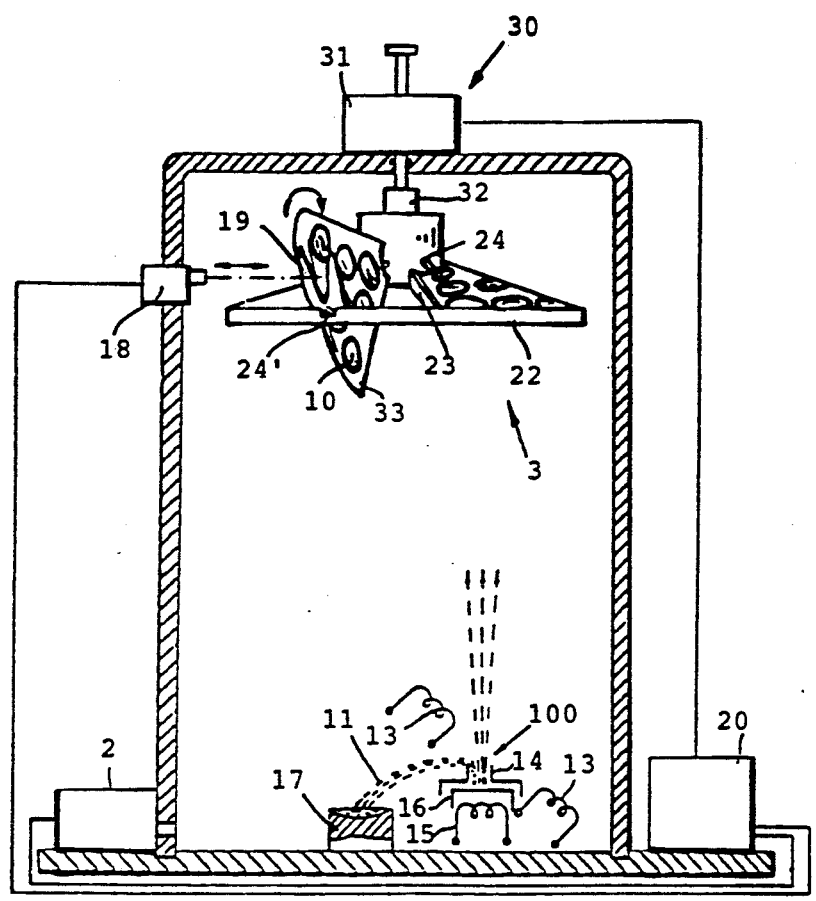
Fig.1
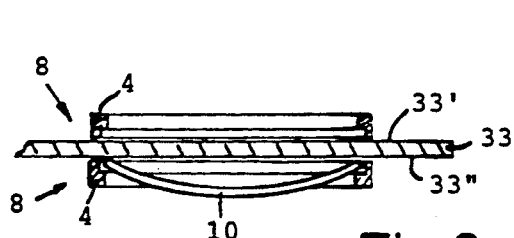
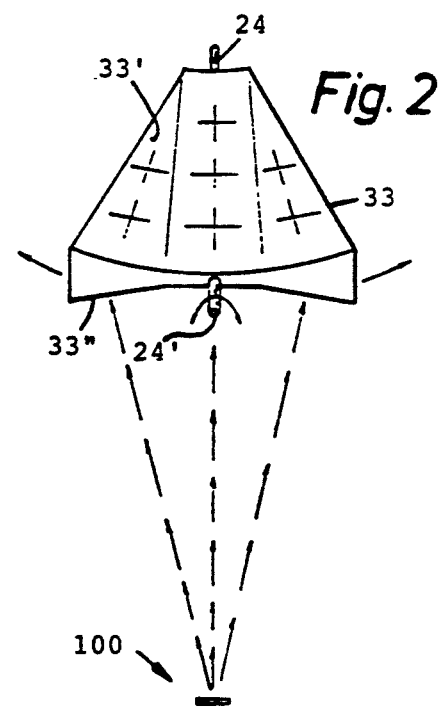
Fig.2
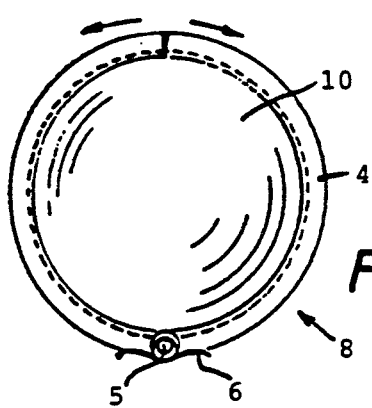
Fig.3
Fig.4

VACUUM APPARATUS FOR COATING AN OPTICAL SUBSTRATE

BACKGROUND OF THE INVENTION

The present invention concerns a vacuum vapour deposition apparatus for coating one side of optical substrates such as plastic spectacle lenses which are distributed on support means which rotate in an evacuable container above at least one vapour source.

Through DE-OS 23 37 204 by the same applicant, a method for the vapour deposition in vacuo of at least one surface layer onto one side of an optical support, in particular a lens, is known, by which after the coating of a specified number of such substrates in the same vacuum cycle, these substrates are moved out of the plane in which the supports are conducted past the vapour source, and subsequently at least once more an equal number of other substrates is conducted into this plane in order to conduct these substrates likewise in succession past the vapour source and to coat the one side thereof in the same vacuum cycle.

In order to carry out this method, which is gaining increasingly in significance, an apparatus is customary which comprises a plurality of stations for the detachable mounting of substrates, these stations being mounted on the periphery of a rotating table which can be placed under vacuum, as well as with at least one vapour source which is movable relative to the stations. In this case, each station is equipped with a pivotable device onto which holders are mounted for the detachable attachment of in each case two substrates, between which a screening extends.

An arrangement with such conventional support plates is not only complicated and expensive, but is also of insufficient capacity.

On the other hand, however, there is also an apparatus known that is equipped with so-called cups as support means. They extend dome-like and rotatable in the upper portion of the container and have a plurality of mounting openings (for example 36) for receipt of the optical substrates distributed uniformly over the cup-like surface.

Such an arrangement by the same applicant is described in U.S. Pat. No. 4,817,559 and is intended for coating both sides of a substrate without intermediate ventilation of the vacuum apparatus. Apart from the fact that the holding and pivoting means for the lenses are complicated and expensive also in the case of this apparatus, such an arrangement for executing the process in question here is not suitable.

SUMMARY OF THE INVENTION

It is therefore, an object of the present invention to provide an improved vacuum vapour deposition apparatus for coating an optical substrate which permits a large number of substrates with the one surface to be coated to be conducted one after the other past at least one vapour source in a single vacuum cycle, in order that then after the coating of the substrates in the same vacuum cycle, these substrates are moved out of the plane in which they are conducted past the vapour source, and subsequently at least once more an equal number of other substrates is conducted into this plane in order to conduct these substrates likewise in succession past the vapour source and to coat the one side thereof in the same vacuum cycle, the arrangement being of the simplest construction and very easy to operate.

This is achieved according to the invention in that the support means comprises a plurality of at least approximately circular segment-shaped pivotable support plates which are positionable cup-like relative to each other and are supported on a common rotating axle, each pivotable about 180°, and each of said pivotable support plates having support areas on both sides with means for clamping securely a plurality of substrates which are to be coated on one side and which sit on the respective supporting areas.

In a preferred embodiment of the arrangement according to the invention it is thereby of advantage that the means for clamping securely the substrates onto the support areas of the pivotable support plates are formed in each case by a clamping ring which embraces and overlaps closely the edges of the substrates which sit on the respective support area and are there disposed split in two parts on a hinge capable of being opened against the effect of a restraining closing spring.

In addition to this, it is of advantage that the support areas of the pivotable support plates are on both sides each constructed with surfaces which are inclined outwards from a centre surface area towards edges of the support plate.

Moreover, a further advantageous embodiment of the apparatus according to the invention is that each pivotable support plate is at least partially supported on a ring rotating with the rotating axle and supports a pivot cam means which cooperates with a positioning pin temporarily movable into the rotating region of the pivotable support plate.

BRIEF DESCRIPTION OF THE DRAWING

Exemplary embodiments of the invention will now be more particularly described with reference to the accompanying drawings wherein:

FIG. 1 is a schematic simplified longitudinal view of a vacuum vapour disposition apparatus for coating one side of a plurality of optical substrates;

FIG. 2 is a schematic diagrammatic enlarged perspective view of a freely tiltable substrate holder of the arrangement according to FIG. 1;

FIG. 3 is a schematic detail, cross-sectional and enlarged view of a substrate mounting according to the invention both sides of the pivotable support holder of the arrangement according to FIG. 1; and FIG. 4 is a plan view of the arrangement according to FIG. 3 on another scale.

DETAILED DESCRIPTION OF THE PREFERRED EMBODIMENTS

The vacuum vapour deposition apparatus illustrated in FIG. 1 for depositing a coating on a plurality of optical substrates, for example plastic spectacle lenses, comprises a container 1 evacuable by a vacuum pump 2. The upper chamber region of this container is provided with support means 3 comprising a plurality, here two, of circular segment-shaped pivotable support plates 33 which are mounted cup-shaped relative to each other and rotate about a common rotating axle 32, each pivotable about 180°. Each pivotable support plate 33 has support areas on both sides with means for clamping securely a plurality of substrates 10 which are to be coated on one side and which sit on the respective supporting areas, as is described in more detail below.

The lower portion of this container 1 is provided with a vapour source 100 (or a plurality of vapour sources) which here comprises an electron beam gun with a heated filament 15 whose electrons are directed in a beam into a focusing unit 16 after heating. For example the electron beam 11 can be produced by a tungsten cathode at a high negative potential and focused with a Whenelt cylinder. This electron beam 11 may be guided by magnetic guide means 13 into a crucible 17 in which the vapour deposition material is located. An oscillatory and/or rotating motion can be imparted to the beam 11 by additional magnet field generating means 14 to scan the entire crucible surface with the electron beam 11.

Devices with operable components which enter the vacuum chamber 1 from the outside, like the rotating mechanism 30 with the motor 31, and the rotating axle 32 for the support means 3, are necessary to operate and/or serve the unit's parts to be moved in the evacuate container 1. All these means are controllable in the usual way by controlling member 20.

The basic structure and construction of a vacuum vapour deposition apparatus is known so that a detailed description of the construction need not be carried out in detail.

Integral to the invention herein is described that the support means 3 comprise pivotable support plates 33 which have approximately circular segment-shaped area limitations.

These pivotable support plates 33, as can be seen in FIG. 1, are mounted cup-shaped relative to each other and rotate about the rotating axle 32, each pivotable about 180°. The pivotable support plates 33 are supported by pivot pins 24 and/or 24' on one side on the free interior end of the rotating axle 32 forming the wheel hub, and on the other side, on a support ring 22 rotating with the rotating axle 32. This support ring 22 is similarly attached rotatably in a spoked wheel by radial bars or spokes 23 for which the rotating axle 32 forms the hub. Each pivotable support plate 33 is located between two neighbouring radial bars 23. For pivoting each of the support plates 33, pivot cam means 19, in the form of a reversing fork, are provided which cooperate with a positioning pin 18 mounted in the vicinity of a wall of the container 1. The positioning pin 18 temporarily may move in the vicinity of the rotating region of the support plate 33 and/or its pivot cam means 19. The positioning pin 18 can be operable electromagnetically or hydraulically or pneumatically and is controllable by controlling member 20.

Such a pivotable arrangement is functionally reliable and user friendly as far as maintenance goes because of its simple conception, but may, however, absolutely be replaced by other controlling means within the scope of the invention.

The pivotable support plates 33, with their pivot pins 24 and/or 24', are appropriately mounted on the rotating axle 32 and the support ring 22 only in an open pivoting shell or cup for easy removal of the support plates for equipping and/or for easy mounting.

In FIG. 2 such a pivotable support plate 33 as specified is seen in detail with its pivot pins 24 and 24', which shows that in this embodiment, seven substrates can be deposited per support at areas 33', 33", which is, of course, not limiting to the invention. In addition to this, it is here also distinguishable that the support areas 33' and/or 33" of said pivotable support plates 33 are, on both sides of support plate 33, each constructed to have a surface inclined outwards from a centre surface area towards an edge of the support plate, which guarantees an optimal angular position with respect to the vapour source. In this way, all substrates attain a uniform coating on all substrate surfaces to be coated.

Furthermore, the pivotable support plates 33 have, as mentioned, means 8 for clamping securely the substrates 10 placed onto said support areas 33', 33" in order to be coated on one side. These means are here formed in each case by a clamping ring 4 which embraces and slightly overlaps the edges of the substrate 10. These clamping rings 4 sit on the respective support areas 33' and/or 33" and are in two parts on a hinge 5 capable of being opened against the effect of a restraining closing spring 6.

This very simple construction guarantees not only easy operating, but also a secure fixing of the substrate on the support plates. The slight overlapping of the edges of the substrates effectively inhibits, moreover, a penetration of the vaporization medium between support plate and substrate.

Thus, from the aforementioned, there results a vacuum vapour deposition apparatus for coating one side of an optical substrate which suffices all demands placed today on such an arrangement, in particular with regard to simplicity, user friendliness and capacity.

Of course, within the bounds of the afore-described apparatus, a large number of modifications are possible without deviating from the basic idea and scope of the invention. This applies to the development of the pivotable means, as well as to the pivotable support plates and/or the means thereof for clamping the substrates securely on the support areas.

While there are shown and described preferred embodiments of the invention, it is to be distinctly understood that the invention is not limited thereto but may be embodied and practised within the scope of the following claims. ACCORDINGLY,

What I claim is:

1. In a vacuum vapour deposition apparatus for coating one side of an optical substrate, such as a plastic spectacle lens, which is distributed on a support means which rotates in an evacuable container above at least one vapour source, an arrangement wherein said support means comprises:
   a plurality of at least approximately circular segment-shaped pivotable support plates, which are positionable cup-like relative to each other and are supported on a common rotating axle, each pivotable about 108°, and each of said pivotable support plates have support areas on both sides with means for clamping securely a plurality of substrates, which are to be coated on one side and which sit on the respective supporting areas, and wherein:
   said means for clamping securely the substrates onto said support areas of said pivotable support plates are formed in each case by a clamping ring, which embraces and overlaps closely the edges of said substrate, and which sits on the respective support area and is there disposed split in two parts on a hinge capable of being opened against the effect of a restraining closing spring.

2. The arrangement as defined in claim 1, wherein: said support areas of said pivotable support plates include at least one surface area inclined outwards from a center surface area towards an edge of the support plate.

3. The arrangement as defined in claim 1, wherein:

each pivotable support plate is at least partially supported on a supporting ring rotating with the rotating axle and supports a pivot cam means which cooperates with a positioning pin temporarily movable into the rotating region of said pivotable support plate.

4. Substrate supporting apparatus for use with a vacuum vapor deposition device, comprising:
   a rotatable axle;
   at least one support ring, having spokes attached to said axle, rotating with said axle;
   a plurality of support plates, pivotably mounted between said axle and a support ring, having support areas on surfaces thereof; and
   means for clamping a plurality of substrates on respective support areas, said means for clamping comprising clamping rings for engaging and overlapping closely edges of respective substrates, each clamping ring being disposed at a respective support area, each clamping ring being divided into two parts and being provided with a closing spring and a hinge for opening the two parts against the effect of the closing spring.

5. The substrate supporting apparatus according to claim 4, wherein said support plates having said support areas include, on both of opposite surfaces thereof, a center surface area and at least one surface area inclined outwards from the center surface area towards an edge of the support plate.

6. The substrate supporting apparatus according to claim 4, wherein said support plates having said support areas include, on both of opposite surfaces thereof, a center surface area and two surfaces areas inclined outwards from the center surface area towards respective edges of the support plate.

7. The substrate supporting apparatus according to claim 4, wherein said support plates are mounted to pivot 180° by pivot pins disposed at ends thereof.

8. The substrate supporting apparatus according to claim 7, further comprising at least one positioning pink, wherein said support plates are each provided with pivot cam means for cooperating with a respective positioning pin to pivot a respective support plate.

9. A vacuum vapor deposition device for depositing material on substrates, comprising:
   an evacuable container;
   an external vacuum pump for controllably evacuating the evacuable container;
   at least one vapor source, disposed at a lower portion of the evacuable container inside the evacuable container, for producing a vapor of material to be deposited on the substrates;
   support means, disposed at an upper portion of the evacuable container inside the evacuable container, for supporting the substrates on pivotable support plates;
   external rotation means, mechanically coupled to the support means by an axle, for controllably rotating the support means;
   positioning means for controllably pivoting the support plates; and
   control means operatively coupled to control operation of the vacuum pump, the rotation means and the positioning means;
   wherein the support means includes at least one support ring having spokes attached to the axle and rotating with the axle, the plurality of support plates being pivotably mounted between the axle and a respective support ring, the support plates having support areas on surfaces thereof; and
   wherein the support means includes clamping means for clamping a plurality of substrates on respective support areas, the clamping means comprising clamping rings for engaging and overlapping edges of respective substrates, each clamping ring being disposed at a respective support area, each clamping ring being divided into two parts and being provided with a closing spring and a hinge for opening the two parts against the effect of the closing spring.

* * * * *